US006858537B2

(12) United States Patent
Brewer

(10) Patent No.: US 6,858,537 B2
(45) Date of Patent: Feb. 22, 2005

(54) PROCESS FOR SMOOTHING A ROUGH SURFACE ON A SUBSTRATE BY DRY ETCHING

(75) Inventor: Peter D. Brewer, Westlake Village, CA (US)

(73) Assignee: HRL Laboratories, LLC, Malibu, CA (US)

(*) Notice: Subject to any disclaimer, the term of this patent is extended or adjusted under 35 U.S.C. 154(b) by 257 days.

(21) Appl. No.: 10/218,055

(22) Filed: Aug. 12, 2002

(65) Prior Publication Data

US 2003/0062335 A1 Apr. 3, 2003

Related U.S. Application Data

(60) Provisional application No. 60/322,119, filed on Sep. 11, 2001.

(51) Int. Cl.[7] .............................................. H01L 21/302

(52) U.S. Cl. ....................... 438/692; 438/697; 438/704; 438/714; 438/734; 216/57; 216/67; 216/88

(58) Field of Search ................................ 438/692, 693, 438/694, 697, 704, 714, 734, 747; 216/57, 67, 88, 89

(56) References Cited

U.S. PATENT DOCUMENTS

| 5,154,023 A | 10/1992 | Sioshansi | 51/323 |
| 5,376,224 A | 12/1994 | Zarowin | 156/643 |
| 6,197,660 B1 * | 3/2001 | Jang et al. | 438/427 |

OTHER PUBLICATIONS

"Diamond Films: Recent Developments," *MRS Bulletin*, vol. 23, No. 9, pp 16–71 (Sep. 1998).

Bollinger, L.D., et al., "Rapid, nonmechanical, damage-free figuring of optical surfaces using plasma-assisted chemical etching (PACE) : Part I Experimental Results," *SPIE* vol. 966, *Advances in Fabrication and Metrology for Optics and Large Optics*, pp 82–90 (1988).

Bollinger., L.D., et al., "Rapid optical figuring of aspherical surfaces with Plasma Assisted Chemical Etching (PACE)," *SPIE* vol. 1618, *Large Optics II*, pp 14–21 (1991).

Dartnell, N.J., et al., "Reactive ion etching of silicon carbide ($Si_xC_{1-x}$) ," *Vacuum*, vol. 46, No. 4, pp 349–355 (1995).

Gallatin, G.M., et al., "Unified approach to the temporal evolution of surface profiles in solid etch and deposition processes," *J. Appl. Phys.*, vol. 65, No. 12, pp 5078–5088 (Jun. 15, 1999).

(List continued on next page.)

Primary Examiner—George A. Goudreau
(74) Attorney, Agent, or Firm—Ladas & Parry LLP

(57) ABSTRACT

A process for smoothing a rough surface on a substrate, such as a diamond or silicon carbide substrate, said rough surface including protruding peak portions separated by valleys, said smoothing comprising (a) depositing a coating on said rough surface so as to adhere to and fill at least the valleys of said rough surface, (b) mechanically polishing the thus coated rough surface so as to achieve a smooth coated surface, and (c) dry etching the smooth coated surface, such as by PACE, so as to remove the remaining coating and at least protruding peak portions of the substrate so as to achieve a smooth surface on the substrate, wherein in the mechanical polishing step (b) the coating is removed at a rate of reduction of thickness greater than the rate at which the substrate is subject to reduction of thickness by the mechanical polishing, and in the dry etching step (c) the coating and substrate are removed at substantially the same or a similar rate of reduction of thickness, and, if necessary, steps (a), (b) and (c) are repeated, or the coating and substrate are removed in separate, alternate preferential etching steps.

38 Claims, 4 Drawing Sheets

OTHER PUBLICATIONS

Hoskins, S.J., "Aspheric surface figuring of fused silica using plasma assisted chemical etching," *SPIE* vol. 2542, *Optomechanical and Precision Instrument Design*, pp 220–230 (1995).

Hoskins, S.J., et al., "Aspheric surface figuring of silicon using Plasma Assisted Chemical Etching (PACE)," *SPIE* vol. 2542, *Optomechanical and Precision Instrument Design*, pp 231–235 (1995).

Mahajan, S., et al., *Principles of Growth and Processing of Semiconductors*, pp 476–477 (1999).

Schlueter, J., e al., "The Emergence of "Post" CMP Within Wafer Non–Uniformity Control Using Adaptive Profile Carriers," *Chemical Mechanical Polishing*, whole document (Oct. 11, 2001).

Zarowin, C.B., "A theory of plasma–assisted chemical vapor transport processes," *J. Appl. Phys.*, vol. 57, No. 3, pp 929–942 (Feb. 1, 1985).

Zarowin, C.B., "Basis of macroscopic and microscopic surface shaping and smoothing by plasma assisted chemical etching," *J. Vac. Sci. Technol. B*, vol. 12, No. 6, pp 3356–3362 (Nov./Dec. 1994).

Zarowin, C.B., "Comparison of the smoothing and shaping of optics by plasma–assisted chemical etching and ion milling using the surface evolution theory," *Applied Optics*, vol. 32, No. 16, pp 2984–2991 (Jun. 1, 1993).

Zarowin, C.B., "Relation between the RF discharge parameters and plasma etch rates, selectivity, and anisotropy," *J. Vac. Sci. Technol. A*, vol. 2, No. 4, pp 1537–1549 (Oct./Dec. 1984).

Zarowin, C.B., "Robust, noniterative, and computationally efficient modification of van Cittert deconvolution optical figuring," *J. Opt. Soc. Am. A*, vol. 11, No. 10, pp 2571–2583 (Oct. 1994).

* cited by examiner

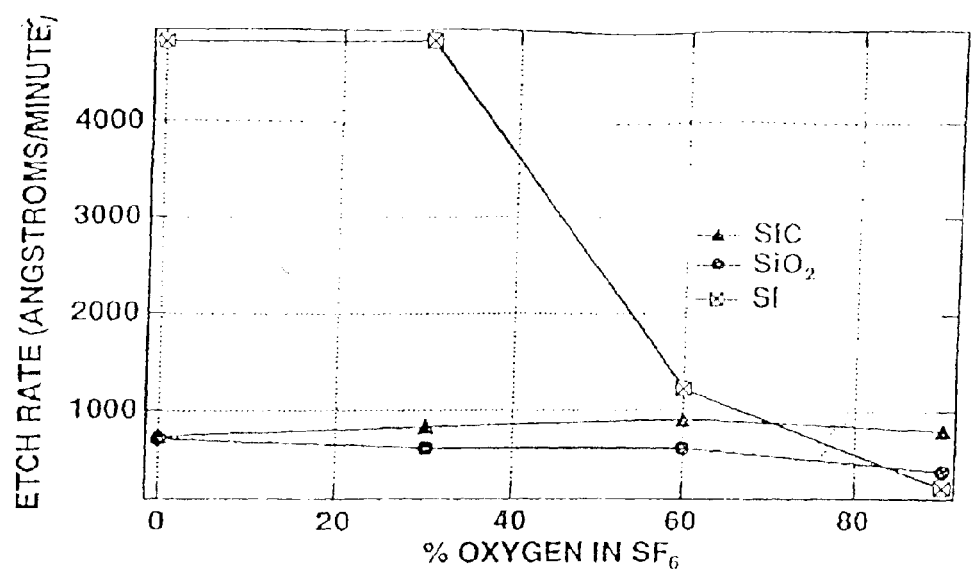
Fig. 7
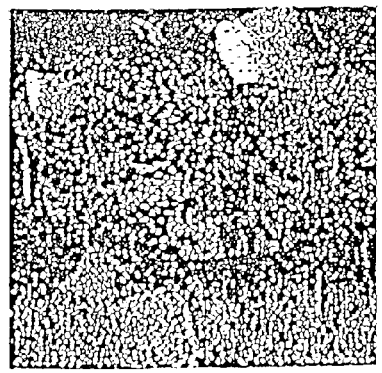   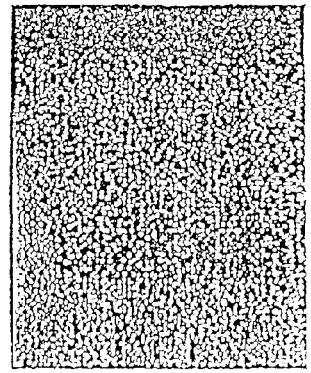
Fig. 8a              Fig. 8b

PROCESS FOR SMOOTHING A ROUGH SURFACE ON A SUBSTRATE BY DRY ETCHING

CLAIM OF BENEFITS OF PROVISIONAL APPLICATION

Applicants claim the benefits of their co-pending U.S. Provisional application Ser. No. 60/322,119, filed on 11 Sep. 2001.

FIELD OF THE INVENTION

The present invention deals with a method for smoothing a rough surface on a substrate, usually of a hard material, particularly diamond, said substrate being free-standing, such as a diamond wafer, or being a film on a supporting substrate, such as a diamond film on a silica substrate. The smooth surface achieved can either have a flat contour, such as on a substrate for an integrated circuit, or a macroscopically curved contour, such as on a smoothed and figured optical lens or window.

DISCLOSURE OF THE PRIOR ART

Moderately hard substrates, such as silicon substrates used in the manufacture of integrated circuits, have been polished by chemical-mechanical polishing. However, such processes are subject to disadvantages due to the contaminants left on the surface by such processing as well as subsurface damage caused in many instances. Dry etching techniques, such as plasma-assisted chemical etching (PACE), have been used for polishing such substrates, such a taught in U.S. Pat. No. 5376,224 of Zarowin. Since there is no mechanical contact with the substrate, or the use of wet chemicals producing residues on the surface of the substrate, this technique has advantages over chemical-mechanical polishing. This technique is usually carried out by a programmed scanning of the PACE etching tool over the surface to be smoothed as disclosed in Zarowin, J. Vac. Sci. Technol, B 12(6) (1994), pages 3356–3362.

Diamond substrates, either as films or as free-standing wafers, and other hard refractory materials are of particular value, such as for optical purposes or for integrated circuits. The synthesis of such diamond materials is generally carried out by chemical vapor deposition methods, which result in the production of a product with a rough surface, including microscopically evident peaks and valleys, typically on the order of tens of microns, e.g., about 30 microns, measured in terms of the difference in elevation between the tips of the peaks and the bottoms of the valleys. The production of such diamond materials is described in MRS Bulletin of September 1998, Vol. 23, No. 9, pages 16–71. The most commonly practiced procedure to smooth diamond films is mechanical polishing. Mechanical polishing of diamond, the hardest known material, involves grinding the rough surface with a series of refined diamond pastes. Such grinding is time-intensive since the grinding material and the substrate are of equal hardness. U.S. Pat. No. 5,154,023 of Sioshansi uses a process that consists of a series of cycles comprising ion implantation exposure followed by mechanical polishing. The ion implantation amorphuses the immediate surface region of the diamond film (typically to about 0.1 micron). This treatment softens the rough surface for mechanical polishing. Nevertheless, dozens of cycles for films with a starting surface roughness of only a few microns is needed. Sioshansi states that despite this labor-intensive implantation-polishing procedure, time is saved compared to conventional mechanical polishing.

Hoskins, on behalf of OCA Applied Optics, in an article by the Society of Photo Optical Instrumentation Engineers (SPIE), vol. 2542, pages 220–230, (1995), entitled "Aspheric Surface Figuring Of Fused Silica Using Plasma Assisted Chemical Etching," mentions on page 221 of this article that "In fact, diamond is an excellent candidate for effective PACE removal mechanism" and states that "in a simple experiment we obtained surface removal on a pure diamond film". The article then states that "The chief material requirement for the use of the PACE process is simply that all of the chemical constituents of the material can be chemically volatilized at near-equal rates". There is nothing reported in the article as to the specific conditions employed in carrying out the process on diamond or the specific characteristics of the product produced. However, the present applicant has found that regardless as to whether the PACE is carried out under isotropic or anisotropic etching conditions, there is significant over-etching, that is, beyond the valleys of the rough surface. In the case of expensive substrates, such as diamond, such over-etching is a distinct disadvantage.

Similarly, in previously reported work, PACE has demonstrated the ability to smooth, thin and figure surfaces of hard materials such as Si, GaAs, SiC and quartz. However, as in the case of diamond, the underlying bulk material is removed to a significant extent because of such over-etching. This characteristic of PACE (and other dry etching methods) is much different from that of mechanical grinding/polishing techniques in which only the rough surface layer or other unwanted material is removed to achieve smoothing.

In the production of integrated circuits PACE is often used together with conventional masking materials such as photoresist to protect the top structure of a substrate from being developed in selective areas so as to permit deep etching of the unprotected portions of the substrate wherein the etch rate of the masking material must be low enough so that full etch depth is achieved before the mask is totally eroded.

SUMMARY OF THE INVENTION

It is an object of the present invention to provide an improved technique which makes it possible to carry out dry etching of substrates with undesired rough surfaces while minimizing the amount of substrate material which is removed by the dry etching beyond the initial rough surface itself. It is a further object to smooth the surface of the rough substrate so as to achieve either a flat contour or a macroscopically contoured curved surface. It is a further object to utilize a pre-etch surface preparation technique.

In accordance with the present invention there is provided a process for smoothing a rough surface on a substrate, said rough surface including protruding substrate portions separated by valleys, said process comprising the following steps:

(a) depositing a coating on said rough surface so as to adhere to and fill at least the valleys of said rough surface;

(b) mechanically polishing the thus coated rough surface so as to achieve a smooth coated surface, and (c) dry etching the smooth coated surface so as to remove the remaining coating and at least the protruding portions of the substrate so as to achieve a smooth surface on the substrate, wherein in the mechanical polishing step (b) the coating is removed at a rate of reduction of thickness greater than the rate at which the substrate is subject to reduction of thickness by the mechanical polishing. The protruding portions of the initial rough surface of the substrate usually include peaks. The smoothing of the rough surface extends to the bottoms of the initial valleys and may extend somewhat below said level but yet with the object of minimizing substrate removal.

The phenomenon with which the present invention deals is that in dry etching of a substrate having a rough surface contour, the rough surface contour is ameliorated by the etching but the general contour is propagated into the substrate itself beyond the original rough surface regardless of whether isotropic and anisotropic etching occurs, as will be later described. In accordance with the present invention one deposits a coating material to fill at least the valleys of the rough surface and achieve, an essentially smooth coated surface when contacting the coated surface, including any protruding peaks of the rough surface, by the mechanical polishing step. When material of the coating and that of the substrate are subject to dry etching under appropriate circumstances, there is a smooth surface imparted to the substrate without the usual consequence of having to over-etch. In accordance with a first embodiment of the invention, the conditions of the dry etching step cause substantially the same rate of reduction of thickness of the material of the coating and the material of the substrate. Under such equal dry etching rates the contour of the smooth coated surface resulting from the mechanical polishing is propagated by the dry etching step so as to form a smooth surface on the substrate substantially proximate to the location of the thus removed rough surface. In accordance with a second embodiment of the invention, in the event that substantially equal etching rates of the coating and substrate are not achieved, there is a repetition of the coating, mechanical polishing and dry etching steps, or only the mechanical polishing and dry etching steps, until the continuous smooth substrate surface is achieved. According to a third embodiment of the invention, preferential etching of the coating and substrate portions, respectively, are carried out in one or more combinations of separate alternate steps until a smooth substrate surface is achieved. These embodiments are further described herein.

The dry etching step has the advantage over wet etching techniques in that vapor species can be readily removed from the material which is etched as compared to the chemical residues of a wet etching technique. Although there are various other types of dry etching techniques, such as reactive ion etching (RIE) and electron cyclotron resonance (ECR), which can be used, it is preferred to use PACE because of high etch rates and material selectivity. PACE employs an RF-induced, high pressure discharge to generate reactive etching species. In contrast to RIE and ECR, which use a bulk plasma that extends over the entire sample, the PACE discharges are confined within a flat, cylindrically shaped etch tool, which is usually scanned over the substrate with a programmable dwell time. What is particularly desired for the purpose of polishing diamond substrates or coatings, is a high density plasma plume with low energy. Such a plume will result in a high etching rate on a diamond surface without the problem of preferential sputtering, which would result from an ion beam technique. Since a diamond coating or wafer often consists of polycrystalline diamond grains, these grains can have different orientations with respect to the wafer surface. Therefore, the sputtering rate of each grain will vary significantly from others depending on the angle between the direction of the grain and the ion beam. Therefore, using the ion beam technique will cause significant uneven sputtering (resulting in roughening of the surfaces instead of polishing).

The present invention is particularly useful with respect to hard materials, namely those having a Mohs hardness number of at least 8. Diamond is rated at 10 on the scale and talc is at 1. SiC has a Mohs hardness of 9.5–9.75. Although it is possible in accordance with the invention to apply the technique to other than truly hard substrates, such as a relatively soft material such as $SiO_2$ (hardness 4.5–6.5) or Si (hardness 7.0), which are much less difficult to polish mechanically, it is usually not advantageous to utilize the process on such relatively soft materials.

The application of the coating material is usually carried out by a spin-on glass process (SOG), using an inorganic silicate or an organic silane or siloxane to produce a silica coating. The film properties of both these are similar to those of low temperature chemical-vapor-deposition (CVD) glasses. The coating process is limited to a thickness of about 5 microns per application due to the strain that develops during the curing process. Encapsulating the rough diamond surface for planarization generally requires multiple coats of the SOG, that is in a series of successive depositions. One can also use chemical-vapor depositions (to produce a silicon or silicon dioxide coating). However, it is also possible to use other techniques such as thermal growth in a gas ambient, plasma deposition, evaporation of metals (under a vacuum) and sputtering. Epitaxial growth is usually not appropriate for producing the coating in carrying out the invention.

The coating is removed by the mechanical polishing at a rate of reduction in thickness greater than is the rate of removal in reduction of thickness of the substrate by the mechanical polishing. In this way it is particularly easy to remove any overlying coating, particularly when the outer surface of the coating is spaced from the peaks. The coating for use with a diamond substrate is typically silicon or silicon dioxide, preferably the latter. Other coating materials suitable for diamond or other substrate materials, said coating material being subject to a higher removal rate by mechanical polishing than is the material of the substrate, include SiC as a coating for diamond and photoresist as a coating for polyimide (a relatively soft material). Preferably the coating material functions as a dielectric. Suitable coating materials for a SiC substrate include $SiO_2$, Si, Ni, Al, Cr, and $SnO_2$, $SiO_2$ and Si being preferred. The mechanical polishing step (b) preferably achieves an optically smooth surface. The macroscopic shape of the coated surface must take on the form of the desired end result (i.e. flat for flat, curved for curved). This requirement necessitates a shaping capability in the mechanical polishing. The polishing procedures used in this step generally involve overlapping polishing of the coated surface using slurries of a polishing rouge containing the basic compounds, with mesh sizes in the 0.01–10 micron range. The abrasive compounds can be one or more of the following compounds: natural diamond, corundum, SiC, $Al_2O_3$, ZrO, MgO, $Cr_2O_3$, and $Fe_2O_3$. The mechanical polishing step preferably lasts between 10 and 60 minutes, by which time the coating layer has been thinned within a few microns of the peaks of the underlying diamond surface.

The dry etching step preferably involves using the plasma-assisted-chemical-etching (PACE) process to shape and smooth the composite oxide-diamond surface. Typical PACE operating conditions for etching diamond films are given in Table I. A number of gas compositions are effective for etching diamond films by PACE include oxygen, oxygen/water mixtures, hydrogen, and a gas containing fluorine, for example, sulfur hexafluoride ($SF_6$), $XeF_2$, and $NF_3$, as well as combinations of two or more such gases including $SF_6$, admixed with oxygen.

TABLE 1

| | |
|---|---|
| RF Power (13.5 MHz) | 300 Watts |
| Gas Pressure | 5 Torr |
| Gas Flow Rate | 100 sccm |
| Gas Composition | Nitrogen/Oxygen/Water = 78%/20%/2% |
| Diamond Etch Rate | 0.5 μm/minute |

Dry etching of SiC has been achieved with fluorine-based chemistry using reactive ion etching (RIE), electron cyclotron resonance (ECR) plasma etching, magnetron enhanced reactive ion etching (MIE), helicon plasmas, inclusively coupled plasmas (ICP) and plasma assisted chemical etching (PACE) methods. Chlorine-based chemistry etching of SiC has also been reported using RIE. The discharge gases used in these etching studies include $CF_4$, $CHF_3$, $SF_6$, and $NF_3$ and $O_2$ mixed with these gases, and premixed $CHF_3/O_2$, $CCl_2F_2/O_2$, and $CCl_4/O_2$ gases. The addition of hydrogen to the discharge mixture has also been employed to suppress the formation of residuals on the substrate surface that can lead to surface roughing and texturing from micromasking effects.

In accordance with the first embodiment of the invention, the conditions of the PACE process or other dry etching process are chosen so that the dry etching rate in terms of the rate of reduction of thickness of the coating is substantially the same as that for the reduction in thickness of the substrate. By "substantially the same" is meant that the etch rates should not vary to an extent not to propagate a smooth surface into the substrate. The variation in etch rates should generally not exceed about 10 percent, preferably 5 percent, and most preferably 2 percent. The PACE etching rate is determined in terms of the (1) gas feed composition (e.g, ratio of nitrogen, oxygen, and water vapor or hydrogen for etching diamond), (2) the RF power density supplied to the PACE as affecting the plasma density, and (3) the pressure in the PACE reactor. A high pressure (e.g. over 5 Torr) will promote primarily a chemical etching reaction whereas a low pressure (e.g., less than 0.1 Torr) will cause mostly physical etching, e.g., by sputtering.

One cannot always ensure that the etching rate for the coating is sufficiently the same as that for the substrate so as to produce a smooth surface on the substrate in accordance with the practice of the first embodiment. Therefore, quite often either the coating or the substrate is reduced in thickness by the dry etching at an undesirably greater rate than the other. When the etching rate for the coating is greater, after a first etching step the coating is removed but protruding peaks of the substrate of reduced size as compared to the untreated substrate still remain. In this event the treated substrate surface is not sufficiently smooth, and one deposits a further coating according to step (a) above, and one repeats steps (b) and (c), and if further necessary to achieve a smooth surface on the substrate, one repeats at least one further sequence of steps (a), (b) and (c) until a sufficiently smooth substrate surface is achieved.

In accordance with the second embodiment of the invention one can carry out the dry etching step (c) so that the rate of removal in terms of depth of the coating and substrate are "similar" so as to vary to a greater extent than would be considered as encompassed by a "substantially the same" rate as described above. Such "similar" etch rates could vary as much as 30%, but preferably less than 15% from each other. In the event that the treated substrate is not sufficiently smooth because of protruding peak portions remaining on the substrate after the dry etching step (c), the process comprises depositing a further coating according to step (a) on the treated substrate and repeating steps (b) and (c), and if further necessary to achieve a specially smooth surface on the substrate, repeating at least one further sequence of steps (a), (b) and (c) until a sufficiently smooth surface is achieved on said substrate. In the event that the treated surface is not sufficiently smooth because of protruding coating portions of the substrate remaining after the dry etching step (c), the process comprises subjecting the treated surface from step (c) to a further mechanical polishing step (b) followed by a further dry etching step (c), and if further necessary to achieve a sufficiently smooth surface because of remaining protruding coating portions, repeating at least one further sequence of steps (b) and (c) until a sufficiently smooth surface is achieved on said substrate.

At the conclusion of the first and any subsequent dry etching steps (c) the process substrate surface is inspected by customary optical and mechanical profilometry so as to achieve a roughness of usually no greater than 1.0 microns so as to have "optical" smoothness for typical applications. For example, when diamond windows are used in infrared applications (λ=10 microns), an optically the smooth surface would have a roughness of <1 micron. For visible applications (500 nanometer wavelength—green light), an optically smooth surface would have a roughness of <500 Å). For silicon integrated circuit manufacturing ultra-smooth surfaces have a roughness <5 Årms. Typical inspection equipment is an atomic force microscope or stylus profilometer. For most diamond substrate surface treatments, several iterations of steps (a), (b) and (c) are required to remove the rough surface layer without substantially etching the underlying diamond substrate material. The PACE etching rate for a diamond substrate is generally always less than that for the coating which is used.

In accordance with the third embodiment of the invention, the dry etching step (c) comprises at least one combination of the following alternating steps:

a step for preferentially etching the coating so as to cause protruding substrate portions to extend beyond the level of the etched coating, and a step for preferentially etching the resulting protruding substrate portions so as to create a substantially smooth surface with the adjacent coating, Preferably, the preferential etching of the coating is terminated before creating too great a height of the protruding substrate portions beyond the etched coating to interfere with achieving a substantially smooth surface with the adjacent coating surface in the subsequent preferential etching of the protruding substrate portions. As a typical etching gas for preferentially removing diamond substrate portions, one uses an etching gas comprising oxygen, usually in combination with nitrogen gas and water vapor. In the event that the coating material comprises silicon or silicon dioxide, which is generally used as a masking material or coating for the diamond substrate, the preferential etching step for removing the coating comprises an etching gas comprising fluorine or chlorine, for example $CF_4$.

The third embodiment employs separate preferential etching steps for the substrate and the coating or mask material, respectively, and alternates the preferential etching processes in order to balance the material removal of the substrate and coating or mask material. In dealing with a diamond substrate this method ordinarily uses the optimized etch process for the diamond component (i.e. high etch rate of about 0.5 μm/mm, high degree of control, low temperature, etc.) and modifies the etching conditions for the mask material to maintain equal material removal rates. The rate for removal of the coating or mask material could be modified by (1) employing the fastest etch process for the mask material while using shorter processing times; (2) using similar etch rate for the coating material as that for the etch rate of the diamond while maintaining equal processing time; or (3) employing a process with a slower etch rate for the coating material while processing the etching of the coating material for a longer time. Ordinarily the first choice would be the best one since it would allow the highest overall etch rate. It is particularly advantageous to repeat a number sequences of the alternate preferential etching steps so as to allow for a smooth surface morphology after each completed cycle. Ordinarily the etching of the coating material should not take place so as to cause the protruding peaks of the substrate material to extend more than the height of one micron beyond the surface of the etched adjacent coating material so as not to interfere with achieving a satisfactorily smooth surface in the subsequent preferential etching of the protruding substrate portion. Usually such diamond peaks would not extend more than about 0.5 $\mu$m and could be as little as 0.1 $\mu$m. By maintaining the height of producing substrate portions above the adjacent etched coating surface within these values, the peaks will be effectively flattened to be flush or smooth with the coating surface as a result of the subsequent preferential substrate etching step.

In general the choice of an etching gas is used to control the relative etch rates of the coating and substrate in all three embodiments of the invention. The choice of the etching gas in the first embodiment to have substantially the same etching rate on the substrate as on the coating can be accomplished by reference to available data on the etch rates of given etching gasses on different materials. In accordance with the third embodiment of the invention a gas can be chosen so as to produce little, if any, etching of the substrate while the coating is being preferentially etched. Vice versa, the gas of the alternate etching step can provide for little, if any, etching of the coating while the substrate is being preferentially etched. For simplicity, one can use a mixture of an etching gas such as $SF_6$ or $CF_4$ and oxygen in which the percentage of oxygen in the gas significantly affects the respective etched rates so that there is significant etching of the coating with little, if any, etching of the substrate at one percentage of oxygen. At a different percentage of oxygen, the reverse applies. On the other hand choice of the proper mixture of etching gases can provide substantially equal rates of etching under the first embodiment of this invention or, with less exactness, similar rates of etching under the second embodiment.

In connection with the above, $SF_6$ is a good etching gas for SiC, Si and $SiO_2$ substrates. As reported in an article entitled "Reactive Ion Etching of Silicon Carbide." by N. J. Dartnell, et al. (Vacuum, volume 46, 349–355 1995, FIG. 5 and table 2 (page 352), equivalent etch rates can be obtained for SiC, Si, and $SiO_2$ under appropriate reactive ion etching (RIE) conditions, using an $SF_6$ plasma admixed with varying amounts of oxygen. In FIG. 7, referred to later herein, there are replotted data from this paper on a common axis to show how the etch rates of any two of these materials can be made to be the same by varying the percentage of oxygen in the $SF_6$ plasma. For example, the etch rates of SiC and $SiO_2$ can be equalized in pure $SF_6$. In this connection reference can be made to Table 2 in which the reported etch ratio of $SiC/SiO_2$ is 1.0 (at an accuracy within about 3.3%). The etch rates of SiC and Si can be made equal at an oxygen percentage of about 71 to 72%, and the etch rates of Si and $SiO_2$ can be made equal at an oxygen percentage of about 84%. These data would indicate how the etch removal rates can be made the same for $SiO_2$- or Si-coated SiC substrates by RIE in the practice of the first embodiment of the present invention. Furthermore, other RIE and ECR literature reports that the addition of oxygen (up to about 60%) to fluorine-based discharges tends to substantially increase the etch rate of SiC and enhances its etch rate relative to Si and $SiO_2$. It has been theorized that in the presence of $O_2$, carbon is removed from the surface in form of CO, $CO_2$, and $COF_2$. This has been supported experimentally using in situ mass spectrometry to monitor the etch products formed during SiC etching. The surface reactions responsible for this behavior are quite complex involving oxygen exchange reactions between Si and C surface species whose rates are enhanced by ion bombardment. It is further believed that these techniques can be applied to the PACE etching of diamond surfaces coated with Si or $SiO_2$ masking materials. It is believed that the plasma conditions under PACE result in highly dense and highly dissociated discharges will have the potential for the highest etch rates. Furthermore, the control of ion energies in PACE and its interplay with the specific surface chemistry can be exploited to control the rates of etching the diamond and silicon surface constituents. PACE, unlike the other ion etching methods described above has the ability to produce and control ion energies well below the sputtering regime (i.e. <10 eV).

In the preferred practice of the invention the coating step (a) is carried out so that the coating extends with its outer surface spaced from the protruding substrate portions or peaks of the rough surface so as to encapsulate the substrate. However, it is possible that some of the peaks extend above the coating, in which event the mechanical polishing removes such protruding peaks before the smooth coated surface is achieved by the mechanical polishing.

Mechanical polishing (b) is carried out in the presence of a chemical agent, resulting in chemical-mechanical polishing. A typical chemical agent that should be present is KOH, in combination with the polishing rouge and water. The potassium hydroxide (KOH) is dissolved in water in a concentration range of 10–60% with its highest activity at about 35% by weight. Diamond-point turning is also a preferred method for mechanical polishing. The mechanical polishing can also include spin-on processes in the case of glasses or photo-resist as a coating. In any event the rate of removal of the coating material by the mechanical polishing with or without the presence of the chemical agent (so as to provide chemical-mechanical polishing) must be greater than the removal rate of the substrate material when it is contacted by said mechanical polishing.

When carrying out the planarizing or shaping procedure by the mechanical polishing with the outer surface of the coating spaced from the rough substrate surface, it is preferred to remove the material just short of the rough surface, usually not more than 5 microns from the highest peaks of the adjacent substrate surface. One can also carry out the mechanical polishing of the coating until reaching the peaks of the rough surface. Where the substrate is of a particularly hard surface, such as diamond, the mechanical polishing can be carried out until resistance to said polishing is encountered on contacting the hard peaks.

The practice of the first embodiment has the advantage of simplicity and efficiency in that both the substrate and the adjacent coating are simultaneously etched in a continuous fashion throughout the process. The third embodiment has the relative disadvantage in that time is, required for switching the etching gas between each alternating etching step. Furthermore, the coating or substrate which is not receiving the preferential etching at the time the other is receiving the preferential etching time does not receive any or relatively little etching at that time. However, if the preferential etching rate of both the coating and the substrate is significantly greater than the simultaneous etching rate of the first embodiment, the average of the etching rates over one complete combination of preferential etching of the substrate and preferential etching of the coating could result in a greater overall etching rate over a period of time than the simultaneous etching rate of the first embodiment. The time for switching of gases is relatively small in comparison to the primary etching time of each alteration. Furthermore, the third embodiment should be easier and more flexible to operate in constant observation of the degree to which either the coating or substrate is removed after a particular step and does not depend on achieving substantially equal simultaneous material removal by proper control of the etching conditions, usually the choice of etching gas, of the first embodiment. The second embodiment requires the additional time devoted to supplemental coating, mechanical polishing and subsequent dry etching steps with each of the repetitions of the cycle. However, under particular circumstances the second embodiment could be the most practical. In general, it is believed that the third embodiment will ultimately prove to be the most advantageous

BRIEF DESCRIPTION OF THE DRAWINGS

FIG. 7 is a graph depicting the etch rates by reactive ion etching SiC, $SiO_2$ and Si substrates using etch gases consisting of $SF_6$ and varying amounts of oxygen as based on published data.

FIG. 8a is an optical microscope photograph magnification of a surface of an untreated diamond sample.

FIG. 8b shows the substrate shown in FIG. 7a after being etched by the PACE process.

DETAILED DESCRIPTION OF THE INVENTION

The PACE smoothing process is markedly different from mechanical smoothing in that it removes more than just the rough surface layer. This behavior has been modeled theoretically using the surface evolution equation that predicts deep material removal for both isotropic and anisotropic smoothing processes as illustrated in FIGS. 1 and 2, respectively.

Figure 1:
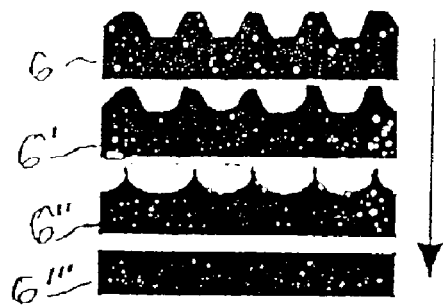
FIG. 1 illustrates isotropic etching to achieve smoothing by PACE.

Isotropic smoothing is best understood by considering a sinusoidal surface (e.g. a single spatial frequency of roughness) as illustrated in FIG. 1 in which the arrow depicts the passage of time of the substrate 6 as it is etched to appear in the shapes 6', 6" and 6"', successively. Isotropic etching removes material in the direction of the local surface normal. Consequently, the "peaks" of the sinusoid are narrowed and the "valleys" are broadened. During this period, the surface is not smoothed; instead, the morphology is gradually altered from sinusoidal to cusped. After cusps are formed, the peak-to-valley amplitude (roughness) decreases as isotropic etching reduces the height of the cusped feature. Isotropic smoothing is common to both high and low pressure plasma processes, but because it does not manifest itself until large amounts of material are removed, it is generally not observed in most slower low pressure dry etching processes. Isotropic etching removes sinusoidal surface "roughness" by uniformly etching normal to the surface. Extremely deep etches are required for smoothing to occur by this mechanism.

Figure 2:
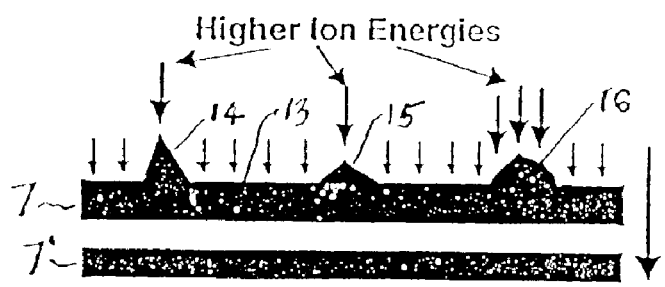
FIG. 2 illustrates anisotropic etching to achieve smoothing by PACE.

Anisotropic smoothing, shown schematically in FIG. 2, on the other hand, occurs only for high pressure (>1 Torr) plasma processing. In this pressure regime the ion experiences many collisions as it traverses the plasma sheath. After each collision, the ion is realigned to some degree by the sheath electric field. However, in the ion's last collision, where it is within a Debye length of the surface, the field seen by the ion is influenced by the surface topology. The electric field in the last free path is greater where there is a peak 14, 15 or 16 (negative surface curvature) and smaller in a valley 13 positive surface curvature). In FIG. 2, etch time progresses from the upper depicted substrate 7, and finally concludes with the lower depicted substrate 7'. Since the etch rate is an increasing function of ion energy, smoothing in an anisotropic etching condition results from higher etch rates at peaks 14, 15 and 16 than in the valleys 13. This mechanism also requires deep etches to smooth rough surfaces because the difference in etch rates between the peaks and valleys is small.

Figure 3:
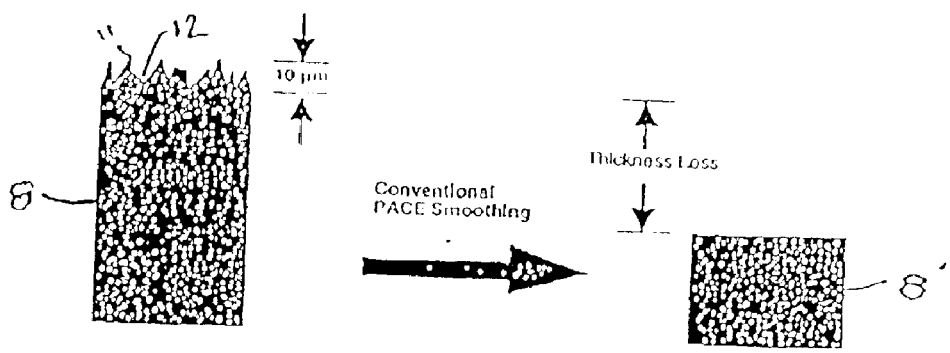
FIG. 3 illustrates the over-etching which occurs under conventional PACE smoothing.

The loss of bulk material during conventional PACE smoothing, by either mechanism (i.e. isotropic or anisotropic processes), is an inherent property of the etching process. This is because the surface roughness is only gradually reduced as the etch proceeds and the roughness pattern of the surface is continually transferred onto the bulk of the substrate, e.g. a wafer. The reduction in thickness of wafer during smoothing by PACE is illustrated in FIG. 3. Substrate 8 has an initial rough surface with peaks 11 separated by valleys 12. The thickness loss to eliminate the peaks and valleys 12 is shown in finally etched substrate 8'.

Figure 4:
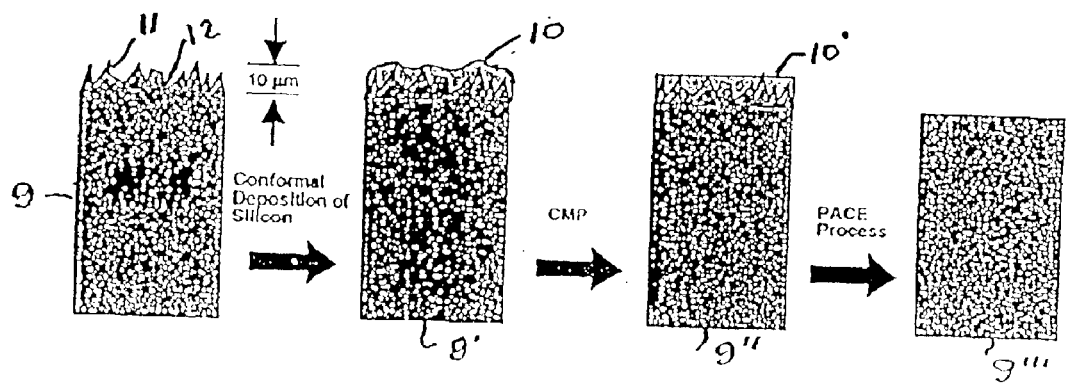
FIG. 4 illustrates the process steps according to the method of a first embodiment of the invention.

The invention will now be illustrated with respect to the first embodiment so as to minimize the amount of surface material which is removed during smoothing of a diamond substrate by PACE. The new method illustrated in FIG. 4, involves the following steps: (a) the deposition of a conformal coating 10 of $SiO_2$ on the rough diamond surface (peaks 11 and valleys 12) of substrate 9, (b) polishing of the newly deposited $SiO_2$ film (i.e. using chemical mechanical methods) (CMP) and (c) PACE of the treated surface to etch below the level of the original rough layer to produce final substrate 9'''. The advantage of this approach is that the etching is restricted to the top of the newly formed flat surface (i.e. the peaks of the original rough layer). The conformal silicon layer masks the recesses and avoids propagating the rough surface pattern into the bulk. This method takes advantage of the hardness properties and the dry etch characteristics of the substrate and coating materials. The dissimilarities in hardness of the silicon coating material and the underlying diamond substrate allow planarizing of the silicon film back to the top of the rough diamond layer. This process prepares a flat surface 10'; for the PACE process to begin with so that the silicon dioxide film will reduce the transferring of the surface roughness to the underlying bulk material so as to eliminate the overetching of the surface to achieve smoothing. Under appropriate control of PACE operating conditions with respect to the combination of coating material and etching gas and substrate, the coating material and substrate can be reduced at substantially the same rate so as to achieve a sufficiently smooth surface on the substrate in a single series of steps. In the event that the protruding peak portions of the diamond substrate still remain (although of reduced dimensions) after the PACE process, the existence of such remaining undesired roughness is determined by optical and mechanical profilometry and the substrate treated after the PACE process is recoated and, in accordance in the second embodiment, the process repeated until the substrate surface has a sufficiently smooth surface. Whether a single sequence of steps is successful in producing a sufficiently substrate surface or whether a series of such sequences is necessary to achieve this degree of smoothness, the over-etching as illustrated in FIG. 3 is significantly reduced or effectively eliminated.

Figure 5:
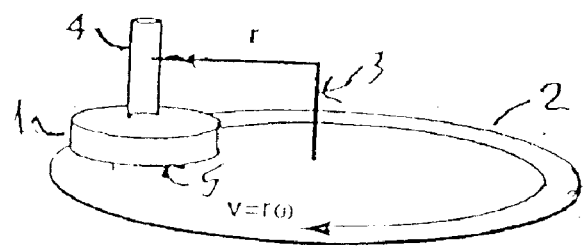
FIG. 5 illustrates a scanning method for use with a PACE etching tool in accordance with the invention.

FIG. 5 is a schematic illustration of the programable scanning of a PACE reactor tool 1 with respect to a rotating diamond wafer 2 which is supported beneath said tool so as to rotate about axis 3. Gas inlet 4 supplies the etching gas comprising oxygen and water vapor to the etching tool, which is further connected to an RF power supply. A typical such PACE etching tool is described in Zarowin U.S. Pat. No. 5,376,224 acknowledged above. The PACE discharge is confined within the interior cavity adjacent the flat undersurface 5 of the tool 1 while the radius r of the path of the tool 1 is incrementally reduced with a programable dwell time. The etched depth under the tool is inversely proportional to scan velocity (v), which is dictated by the product of rotational velocity (ω) and the radius r of the path of the etch tool 1. The time duration at each position on the sample determines its exposure to plasma and hence, the amount of material removed. Although the original design of the PACE reactor to move in a programable manner as illustrated in FIG. 5 was to rapidly and precisely shape and polish optical and electronic materials without mechanical contact and without the generation of subsurface damage, its application to the present invention uses only its most basic scanning functions. Reference can be made to the above acknowledged publication by Zarowin (1994) for further details of the scanning process.

Figure 6:
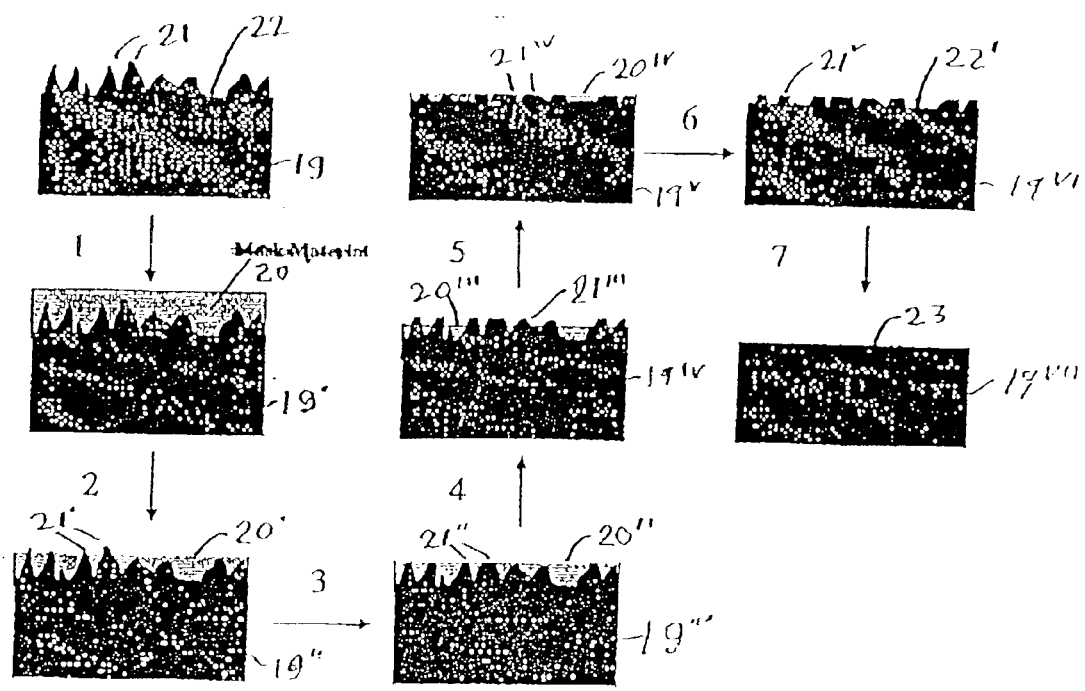
FIG. 6. illustrates the process steps according to the method of a third embodiment of the invention.

FIG. 6, schematically illustrates the process flow for the third embodiment of the invention. The process is shown as a seven step process; in practice this process would repeat steps 2 3 2' 3' 2" 3" etc. until complete. The description of the individual steps is as follows:

1) Coat the substrate 19 with the rough diamond having peaks 21 and valleys 22 with silicon dioxide or silicon overlayer and planarize using chemical-mechanical polishing techniques.

2) In the PACE reactor, etch coating material using appropriate etch gas mixture; remove 0.5 μm of coating material to reveal tips of peaks 21" of the original diamond surface.

3) In the PACE reactor, switch etch gases to chemistry for diamond etch to re-smooth surface (laser beam scattering techniques can be used to monitor surface morphology for in situ, real-time monitoring), thereby smoothing peaks 21' to form effectively flattened peaks 21" flush with coating surface 20".

4) In the PACE reactor, cycle the etch gases preferentially to coating material etch chemistry and etch to reveal next level diamond peaks 21''' (about 0.5 μm) above coating surface 20'''.

5) Preferentially etch substrate peaks 21''' whereas to form flattened peaks $21^{IV}$ substantially level with surface $20^{IV}$ of the coating.

6) Preferentially etch the coating down to flattened proportions 22' of the surface of the substrate, whereby the coating material has been substantially completely removed while leaving projecting flattened peaks $21^V$.

7) Preferentially etch the projecting substrate peaks $21^V$ so as to obtain an eventual flat smooth surface 23 of the final substrate $19^{VII}$.

The selection of the preferential etching conditions is most conveniently accomplished by the choice of different etching gases for the ultimate etching step so as to provide sufficiently different etching rates for the substrate and the coating as discussed above. FIG. 7 shows data regarding the reactive ion etching of SiC, $SiO_2$ and Si substrates by $SF_6$ etching gas with oxygen optionally being present to various degrees as based on data taken from N. J. Dartnell, M. C. Flowers, R. Greef and J. Zhu Vacuum, Vol 46 349 (1995). The coating Si would be a suitable coating for SiC since the etch rate at 30% oxygen in $SF_6$ is 4800 Angstroms/min, whereas the etch rate for SiC is 800 Å/min. at this concentration. The etch rate at 90% oxygen is 300 Å/min for Si and 900 Å/min for SiC. It is noted that the graph for $SiO_2$ is substantially parallel to that for SiC and intersects at 0% oxygen. Therefore, $SiO_2$ would not be a suitable coating for SiC under the third embodiment but would be a suitable coating for SiC under the first embodiment, particularly at 0% oxygen.

Although the design of the PACE reactor is fundamentally different from any other plasma etching system, the basis of its etching action relies on the same neutral and ionic chemical reactions. To illustrate this point, the ion and neutral reactions are given below for a generic etch scheme, where S is the semiconductor solid A and $A^+$ are the neutral and ionic reactant species generated by the plasma, $e^-$ are the electrons, and B are the volatile products of the etching reactions.

$$S + A \xrightarrow{k_f} B \quad (1)$$

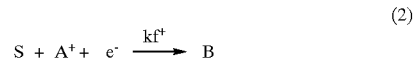

$$S + A^+ + e^- \xrightarrow{k_f^+} B \quad (2)$$

Obviously, the modeling of actual etching reactions using molecular discharge gas mixtures and a binary solid is very complex and requires the inclusion of dozens of reactions. However, Eqs. 1 and 2 can be used to generally highlight many of the similarities and differences observed in PACE and RIE. The limiting rates for the neutral and ionic reactions are $R_o = k_f[A]$ and $R_+ = k_f^+[A^+]$, respectively. The total etch rate can be written simply as the sum of the neutral and ion etch rates, $R = R_o + R_+$. The rate constant ($k_f$) for the neutral reaction is dependent only on the activation energy of the reaction, $E_f$ and the temperature of the solid $k_f = k\exp(-E_f/kT)$. The rate constant for the ion reaction ($k_f^+$) is similarly dependent on the temperature of solid; however, its activation energy ($E_{f+}$) is reduced by an amount proportional to the kinetic energy of the ions (U), $k_f = k\exp(-E_{f+}-U)/kT)$. From this the ion energy, or increase the ionic and/or the neutral reactant concentrations.

The following is an example of a diamond substrate treated by the PACE process without practice of the present invention.

EXAMPLE I

A 1 $cm^2$ diamond substrate prepared by chemical vapor deposition is shown in FIG. 8a, which microphotograph is shown at 50× magnification. The surface roughness was about 30 microns (peak-valley) and the overall substrate thickness was about 1.5 mm. The sample was degreased with solvents (acetone, methanol, and water) and dried prior to plasma etching. The PACE processing conditions were as follows: plasma gases (air mixture consisting of 78% nitrogen, 20% oxygen, 2% water vapor), RF power of 300 watts, sample temperature 23° C., and an etch rate 0.5 microns/min. As shown in FIG. 8b, the gross roughness was removed from the diamond surface after PACE processing. In this example 350 microns of the original substrate was removed in order to achieve this smooth surface condition. In this connection the root mean square of the surface roughness was about 0.10 micron.

EXAMPLE II

In accordance with a specific example of the present invention advantage is taken of the smoothness achieved by the PACE process except that the diamond surface is first coated with a composition comprising $SiO_2$ by the spin-on-glass process so as completely to encapsulate the substrate surface with coating at a depth of about 40 microns. In order to achieve this thickness, a series of thin dielectric layers of the coating material are sequentially piled on top of each other until the original peaks of the substrate are no longer visible. After the coated surface has been formed, the entire surface is mechanically polished with a polishing composition comprising potassium hydroxide in combination with a polishing rouge of diamond paste and water for between 10 and 60 minutes so as to achieve diminishing the thickness of the coating to within no more than 5 microns of the protruding peak portions of the substrate. In any event polishing is immediately halted as soon as contact is achieved with the peaks of the substrate, which can be readily detected by the increased resistance to grinding. The above mechanically polished coated substrate is then subject to the PACE etching as per Table II below.

TABLE II

| | |
|---|---|
| RF Power | 300 Watts |
| Gas Pressure | 5 Torr |
| Gas Flow Rate | 100 sccm |
| Gas Composition | $SF_6$ |
| $SiO_2$ Etch Rate | 0.3 μm/min |
| Diamond Etch Rate | about 0.3 μm/min |

If measurement of the substrate smoothness after removal of all of the coating by the PACE process shows a root mean square (rms) of above the desired 0.10 microns, the surface is subjected to a repeat cycle of the recoating by the spin-on-glass process, the mechanical grinding and the PACE. However, the roughness of substrate after the first treatment cycle is considerably less than the original roughness of about 30 microns. One or more further repetitions of the cycle of the coating, grinding and PACE may be necessary to obtain the ultimately desired smoothness. It is not usually expected that the number of such repetitive cycles will exceed four. Regardless of whether several repeat cycles are necessary, a measurement of the resulting substrate thickness indicates that significantly less substrate is ultimately removed as compared to practicing the PACE processing according to Example I. However, the same degree of smoothness (about 0.1 micron rms) is obtained.

It will be appreciated that the present invention can employ variations of the specific embodiments as described herein. The primary advantage of the present invention is that it reduces the amount of over-etch in a dry etching process for the purpose of achieving a smooth surface. Although maximum advantage is achieved in this connection with a diamond substrate, particularly one produced by CVD, the invention is also applicable to other substrates such as silicon carbide, single crystalline silicon, quartz or GaAs substrates wherein, for example, PACE smoothing usually requires an over-etch factor of about 3 to 5.

What is claim is:

1. A process for smoothing a rough surface on a substrate, said rough surface including protruding substrate portions separated by valleys, said process comprising:
    (a) depositing a coating on said rough surface so as to adhere to and to fill at least the valleys of said rough surface,
    (b) mechanically polishing the thus coated rough surface so as to achieve a smooth coated surface, and
    (c) dry etching the smooth coated surface so as to remove the remaining coating and at least the protruding portions of the substrate so as to achieve a smooth surface on the substrate,
    wherein in the mechanical polishing step (b) the coating is removed at a rate of reduction of thickness greater than the rate at which the substrate is subject to reduction of thickness by the mechanical polishing.

2. A process according to claim 1, wherein the smooth surface of the substrate resulting from the dry etching step has a flat contour.

3. A process according to claim 1, wherein the smooth surface of the substrate resulting from the dry etching step has a macroscopically curved contour.

4. A process according to claim 1, wherein the contour of the smooth coated surface resulting from the mechanical polishing step is propagated onto the substrate surface resulting from the dry etching step.

5. A process according to claim 1, wherein the dry etching Step comprises plasma-assisted chemical etching (PACE).

6. A process according to claim 5, wherein the PACE is carried out by a programmed scanning of a PACE etching tool over the coated surface.

7. A process according to claim 1, wherein the mechanical etching step is carried out in the presence of a chemical agent so as to provide chemical-mechanical etching.

8. A process according to claim 1, wherein the coating is deposited so as to cover substantially the entire rough surface.

9. A process according to claim 1, wherein the deposited coating covers the entire rough surface, including the protruding substrate portions.

10. A process according to claim 8, wherein the outer surface of the coating is spaced from the protruding substrate portions of the rough surface.

11. A process according to claim 10, wherein the mechanical polishing of the coating is carried out until just short of the rough surface.

12. A process according to claim 8, wherein the mechanical polishing of the coating is carried out until reaching the peak portions.

13. A process according to claim 12, wherein the mechanical polishing is carried out until resistance to said polishing is encountered on contacting said protruding peak portions.

14. A process according to claim 1, wherein the material of the substrate has a hardness of at least 8 on the Mohs Scale.

15. A process according to claim 14, wherein the material of the substrate is diamond.

16. A process according to claim 15, wherein the diamond substrate is produced by chemical vapor deposition.

17. A process according to claim 13, wherein the substrate is silicon carbide.

18. A process according to claim 1, wherein the dry etching process employs an etching gas comprising oxygen.

19. A process according to claim 1, wherein the dry etching process employs an etching gas comprising $SF_6$.

20. A process according to claim 1, wherein the coating step (a) is carried out in a series of successive depositions.

21. A process according to claim 1, wherein the coating step (a) is carried out by a spin-on glass process.

22. A process according to claim 1, wherein in the dry etching step (c) the coating and substrate are removed at substantially the same rate of reduction of thickness so as to propagate the contour of the smooth coated surface resulting from the mechanical polishing step (b) onto the substrate surface resulting from the dry etching step (c).

23. A process according to claim 22, in the event that a sufficiently smooth surface is not achieved by said dry etching step (c), said process includes depositing a further coating according to step (a) on the surface treated by said dry etching step (c) and repeating steps (b) and (c) so as to achieve a sufficiently smooth surface, and if further necessary to achieve a sufficiently smooth surface on the substrate, repeating at least one further sequence of steps (a), (b) and (c) until a sufficiently smooth surface is achieved on said substrate.

24. A process according to claim 1, wherein the dry etching step (c) comprises at least one combination of the following alternating etching steps:
   a step for preferentially etching the coating so as to remove coating material and to result in protruding substrate portions extending beyond the level of the adjacent etched coating, and
   a step for preferentially etching protruding substrate portions so as to lower the height of protruding substrate portions with respect to the adjacent coating,
   wherein one or more of said combinations of said alternate etching steps are carried out until the coating is removed from the resulting substrate surface and a smooth surface on the substrate is achieved.

25. A process according to claim 24, wherein the preferential etching of coating is terminated before creating too great a height of the protruding substrate portions beyond the etched coating to interfere with achieving a substantially smooth surface with the adjacent coating surface as a result of the subsequent preferential etching of the protruding substrate portions.

26. A process according to claim 24, wherein the step for preferentially etching the coating uses an etching gas for preferentially etching the coating and the step for preferentially etching the substrate uses an etching gas for preferentially etching the substrate.

27. A process according to claim 24, wherein the dry etching step comprises plasma-assisted chemical etching (PACE).

28. A process according to claim 24, wherein the material of the substrate has a hardness of at least 8 on the Mohs Scale.

29. A process according to claim 28, wherein the preferential etching step for removing the protruding substrate portions uses an etching gas comprising oxygen.

30. A process according to claim 28, wherein the coating comprises silicon or silicon dioxide and the preferential etching step for removing said coating comprises an etching gas comprising fluorine or chlorine atoms.

31. A process according to claim 30, wherein the dry etching step comprises plasma-assisted chemical etching (PACE).

32. A process according to claim 24, wherein the coating is deposited so as to cover substantially the entire rough surface.

33. A process according to claim 24, wherein the outer surface of the coating is spaced from the peak portions of the surface.

34. A process according to claim 24, wherein the mechanical polishing of the coating is carried out until just short of the rough surface.

35. A process according to claim 24, wherein the coating step (a) is carried out by a spin-on glass process.

36. A process for smoothing a rough surface on a substrate, said rough surface including protruding substrate portions separated by valleys, said smoothing comprising:
   (a) depositing a coating on said rough surface so as to adhere to and to fill at least the valleys of said rough surface,
   (b) mechanically polishing the thus coated rough surface so as to achieve a smooth coated surface, the coating being removed by the mechanical polishing at a rate of reduction in thickness greater than the rate in reduction in thickness at which the substrate is subject to removal by the mechanical polishing,
   (c) dry etching the smooth coated surface so as to remove the remaining coating and at least the protruding portions of the substrate, the coating and the substrate being removed at a similar rate of reduction of thickness by the dry etching so as to achieve a smooth surface on the substrate, and
   d) in the event that the treated substrate is not sufficiently smooth because of protruding substrate portions remaining on the substrate after the dry etching step (c), depositing a further coating according to step (a) on the treated substrate and repeating steps (b) and (c), and if further necessary to achieve a sufficiently smooth surface on the substrate, repeating at least one further sequence of steps (a), (b) and (c) until a sufficiently smooth surface is achieved on said substrate.

37. A process according to claim 36, wherein the dry etching step comprises plasma assisted chemical etching (PACE).

38. A process for smoothing a rough surface on a substrate, said rough surface including protruding substrate portions separated by valleys, said smoothing comprising:
   (a) depositing a coating on said rough surface so as to adhere to and to fill at least the valleys of said rough surface,
   (b) mechanically polishing the thus coated rough surface so as to achieve a smooth coated surface, the coating being removed by the mechanical polishing at a rate of reduction in thickness greater than the rate in reduction in thickness at which the substrate is subject to removal by the mechanical polishing,
   (c) dry etching the smooth coated surface so as to remove the remaining coating and at least the protruding portions of the substrate, the coating and the substrate being removed at a similar rate in terms of depth by the dry etching for the purpose of producing a smooth surface on the substrate, and
   (d) in the event that the treated surface is not sufficiently smooth because of protruding coating portions of the substrate remaining after the dry etching step (c), subjecting the treated surface from step (c) to a further mechanical polishing step (b) followed by a further dry etching step (c), and if further necessary to achieve a sufficiently smooth surface because of remaining protruding coating portion, repeating at least one further sequence of steps (b) and (c) until a sufficiently smooth surface is achieve on said substrate.

* * * * *